(12) United States Patent
Dufrene et al.

(10) Patent No.: US 8,971,835 B2
(45) Date of Patent: Mar. 3, 2015

(54) RECEIVER WITH WIDE DYNAMIC RANGE AND LOW POWER CONSUMPTION

(75) Inventors: Krzysztog Dufrene, Plesching (AT); Elmar Wagner, Taufkirchen (DE)

(73) Assignee: Intel Mobile Communications GmbH, Neubiberg (DE)

( * ) Notice: Subject to any disclaimer, the term of this patent is extended or adjusted under 35 U.S.C. 154(b) by 753 days.

(21) Appl. No.: 12/984,864

(22) Filed: Jan. 5, 2011

(65) Prior Publication Data
US 2012/0169419 A1    Jul. 5, 2012

(51) Int. Cl.
H04B 1/10    (2006.01)
H03D 7/14    (2006.01)
H03D 1/22    (2006.01)
H03D 7/16    (2006.01)

(52) U.S. Cl.
CPC .......... H03D 7/1441 (2013.01); H03D 1/2245 (2013.01); H03D 7/1458 (2013.01); H03D 7/165 (2013.01); H03D 2200/0084 (2013.01)
USPC ............ 455/296; 455/307; 455/311; 375/346

(58) Field of Classification Search
CPC ........ H04B 1/10; H04B 15/00; H04B 1/1036; H04B 1/525; H04B 1/1081; H04B 1/7107
USPC ........................ 455/266, 283, 284, 311, 296
See application file for complete search history.

(56) References Cited

U.S. PATENT DOCUMENTS

| | | | |
|---|---|---|---|
| 6,292,052 B1* | 9/2001 | Carlson | 330/9 |
| 6,975,674 B1* | 12/2005 | Phanse et al. | 375/219 |
| 7,154,331 B2* | 12/2006 | Zaguri | 330/254 |
| 2006/0057999 A1* | 3/2006 | Behzad et al. | 455/323 |
| 2006/0094386 A1* | 5/2006 | Darabi et al. | 455/296 |
| 2009/0029668 A1* | 1/2009 | Hsieh et al. | 455/324 |
| 2009/0239495 A1* | 9/2009 | Sellars et al. | 455/333 |
| 2012/0021712 A1* | 1/2012 | Mikhemar et al. | 455/234.1 |

OTHER PUBLICATIONS

Mario Valla, et al., "A 72-mW CMOS 802.11a Direct Conversion Front-End with 3.5-dB NF and 200-kHz 1/f Noise Corner", IEEE Journal of Solid-State Circuits, vol. 40, No. 4, Apr. 2005, p. 970-977.
Josef Zipper, et al., "A Single-Chip Dual-Band CDMA2000 Transceiver in o.13 um CMOS", IEEE Journal of Solid-State Circuits, vol. 42, No. 12, Dec. 2007, p. 2785-2794.

(Continued)

*Primary Examiner* — Yuwen Pan
*Assistant Examiner* — Fatuma Sherif
(74) *Attorney, Agent, or Firm* — Eschweiler & Associates, LLC

(57) ABSTRACT

Some embodiments of the invention relate a circuit having a first and a second electrically connected voltage domains, respectively biased at different supply voltages (e.g., the first voltage domain biased at a low bias voltage and the second voltage domain biased at a second, different supply voltage). The apparatus further comprises a first DC current source coupled to one of the voltage domains (e.g., the first voltage domain having a low DC voltage potential) and a second DC current source coupled to the other voltage domain (e.g., the second voltage domain having a high DC voltage potential). The first and second DC current sources are configured to provide a DC cancellation current having a value that cancels a DC current generated by the potential difference between the first and second voltage domains.

20 Claims, 5 Drawing Sheets

(56) References Cited

OTHER PUBLICATIONS

Vojkan Vidojkovic, et al., "A Low-Voltage Folded-Switching Mixer in 0.18-um CMOS", IEEE Journal of Solid-State Circuits, vol. 40, No. 6, Jun. 2005, p. 1259-1264.

Nuntachai Poobuapheun, et al., "A 1.5-V 0.7-2.5-GHz CMOS Quadrature Demodulator for Multiband Direct-Conversion Receivers", IEEE Journal of Solid-State Circuits, vol. 42, No. 8, Aug. 2007, p. 1669-1677.

Chinese Office Action dated May 5, 2014 in connection with Chinese Patent Application Serial No. 201210041460.X.

* cited by examiner

RECEIVER WITH WIDE DYNAMIC RANGE AND LOW POWER CONSUMPTION

BACKGROUND

Modern day integrated chips used in wireless communication devices (e.g., for mobile phones) comprise receiver chains that are configured to receive incoming signals from an antenna, amplify the received incoming signals, and demodulate the amplified incoming signals without reducing the quality of the signals (e.g., through the addition of undesired noise to the received signals).

Demodulation of an incoming signal may be performed using a mixer that receives a high radio frequency (RF) signal, performs frequency conversion of the signal from the RF frequency to a lower intermediate frequency (IF), and outputs the lower IF frequency signal to circuit components configured to perform further processing (e.g., filtering). The quality and performance of a wireless communication device depends to a large extent on the mixer's conversion gain (e.g., ratio of output signal amplitude to input signal amplitude) and signal-to-noise ratio. Ideally, demodulation is performed with a low degradation of signal-to-noise ratio and a high conversion gain. Therefore, active mixers with active preamplifiers and passive switching stages are often used in wireless communication applications since they allow for an improved signal-to-noise ratio (e.g., to decrease deterioration of noise) compared to the purely passive mixers, thereby improving reception sensitivity of a receiver.

DRAWINGS

DETAILED DESCRIPTION

Figure 1:
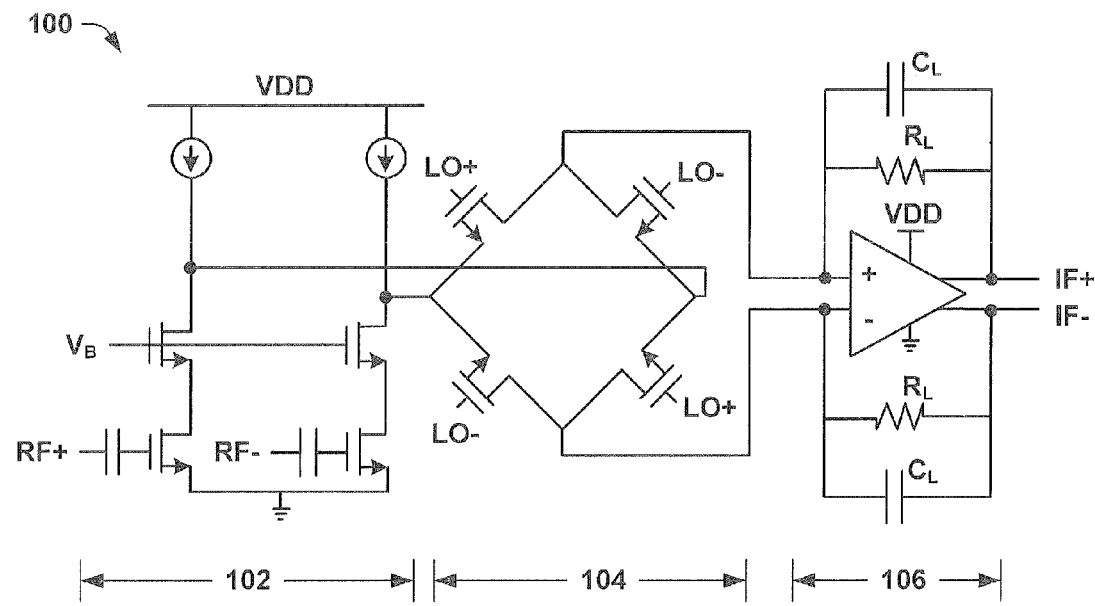
FIG. 1 illustrates a circuit diagram of a typical demodulation circuit comprising an active preamplifier and passive switching/mixing stage.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

A typical transceiver circuit 100 having an active mixer architecture, as shown in the block diagram of FIG. 1, comprises an input/pre-amplifier stage 102, a mixer/switching stage 104, and an output/filtering stage 106. The input/pre-amplifier stage 102 is configured to receive a radio frequency (RF) input voltage signal RF+/RF− (e.g., from an antenna not shown in FIG. 1) and to convert the received RF input voltage signal to a current signal. The current signal is provided to the switching stage 104, where it is multiplied with a local oscillator (LO) signal LO+/LO− to generate an intermediate frequency (IF) current signal. The IF current signal flows from the switching stage 104 to an output stage 106 that is configured to convert the IF current signal back to a voltage signal and while providing filtering of the IF current signal.

During operation, demodulation circuits having an active mixer architecture consume considerable power, especially in the pre-amplifier stage 102. To reduce the power consumption of a demodulation circuit having an active mixer architecture, the input stage 102 and output stage 106 may be biased at a low supply voltage VDD. While the low supply voltage VDD provides for a reduced power consumption in the input stage 102 and the switching stage 104, it also reduces the dynamic range at the output stage 106 of the receiver chain since it decreases voltage headroom available for accommodation of large interfering signals (e.g., output from the demodulator). Alternatively, the circuit 100 may be biased at a high supply voltage VDD providing for a large dynamic range, but also generating a large power consumption.

Since the power consumption of a transceiver circuit is an important design concern, it is beneficial to make such power consumption low. However, power consumption considerations are typically balanced with performance considerations. To address both of these concerns, the present invention allows for decreasing power consumption (e.g., compared with state-of-the-art solutions) without deteriorating dynamic range of the receiver.

Accordingly, a method and apparatus for providing a transceiver circuit having a broad dynamic range and low power consumption is provided herein. In one embodiment, the apparatus comprises a circuit having a first and a second electrically connected voltage domains, respectively biased at different supply voltages (e.g., the first voltage domain biased at a low bias voltage and the second voltage domain biased at a second, different supply voltage). The differences in the supply voltages between the different domains/stages of the circuit can cause an unwanted DC current to flow between the first and second voltage domains (e.g., an unwanted DC current flowing from a high to low supply voltage may be detrimental to the operation of the receiver chain). To remove this unwanted DC current the apparatus may further comprise a first DC current source coupled to one of the voltage domains (e.g., the first voltage domain having a low DC voltage potential) and a second DC current source coupled to the other voltage domain (e.g., the second voltage domain having a high DC voltage potential). The first and second DC current sources are configured to provide a DC cancellation current having a value that cancels an unwanted DC current generated by the potential difference between the first and second voltage domains.

In a more specific embodiment, the apparatus may comprise a transceiver circuit having a receiver chain having an input/pre-amplifier stage, a mixer/switching stage, and an output/baseband filtering stage. The pre-amplifier stage is biased at a low supply voltage causing the pre-amplifier and switching stages to operate at a low voltage to provide low power consumption. The output stage is biased at a high supply voltage causing it to operate at a high voltage that provides the transceiver with a broad dynamic operating range. A first DC current source is coupled to a low voltage input of the output stage, while a second DC current source is coupled to a high voltage output of the output stage. Together, the first and second DC current sources provide a DC cancellation current having a value that prevents (e.g., cancels) an unwanted DC bias current generated by the potential difference between the high DC voltage potential and the low DC voltage potential from reaching the mixer stage. The DC cancellation current therefore allows the mixer stage to operate in a passive mode of operation (e.g., no DC current flow through the mixer stage) since no unwanted DC bias current is flowing through it.

Figure 2:
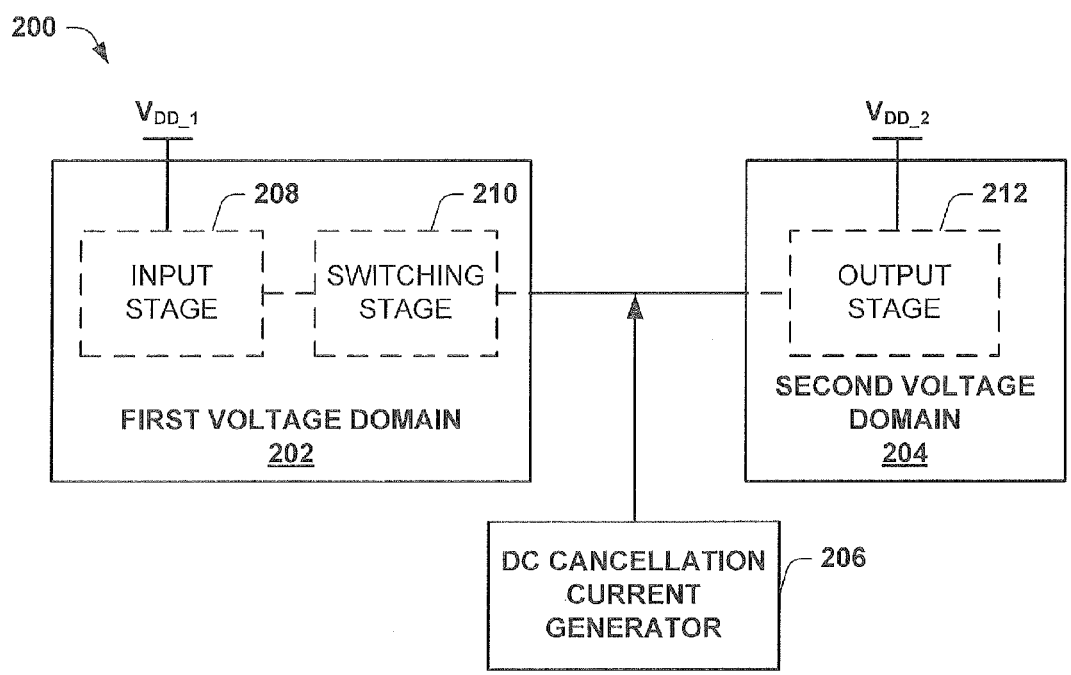
FIG. 2 illustrates a block diagram of a first embodiment of a circuit configured to prevent unwanted DC bias current from flowing between a first voltage domain and a second voltage domain.

FIG. 2 illustrates a block diagram of a first embodiment of a circuit 200 configured to prevent unwanted DC bias current from flowing between a first voltage domain and a second voltage domain. The circuit 200 (e.g., demodulation circuit) comprises a circuit architecture wherein different domains/stages of the circuit are biased at different supply voltages based upon their functionality (e.g., their power consumption, headroom, etc.). As shown in FIG. 2, a first voltage domain 202 of the circuit is configured to be biased by a first (e.g., low) supply voltage $V_{DD\_1}$, while a second voltage domain 204 of the circuit is configured to be biased by a second (e.g., high) supply voltage $V_{DD\_2}$.

In one embodiment, the use of different supply voltages allow for certain circuits having high power consumption to receive a reduced supply voltage, thereby reducing the overall power consumption of the circuit, while other circuits may remain biased at a high supply voltage (e.g., larger than the small supply voltage) so as to enable a large dynamic operating range. For example, in one embodiment, the first voltage domain 202 may comprise a pre-amplifier/input stage 208 and/or a switching/mixer stage 210 biased at a low supply voltage and the second voltage domain 204 may comprise an output stage 212 biased at a high supply voltage (e.g., a supply voltage greater than the low supply voltage). Since the pre-amplifier/input stage 208 is biased at a low supply voltage the overall power consumption of the receiver chain is lowered since the supply voltage is low in the domain where most of the circuit's power is dissipated. Furthermore, biasing the output stage 212 at a higher supply voltage provides the receiver chain with a broad dynamic operating range.

Differences in the supply voltages and voltage potentials between the different domains/stages of the circuit can cause an unwanted DC current to flow between the first and second voltage domains. For example, if the first voltage domain 202 is biased using a low supply voltage and the second voltage domain 204 is biased using a high supply voltage an unwanted DC current $I_{DC}$ may flow from the second voltage domain 204 to the first voltage domain 202. Such an unwanted DC current may be detrimental to the operation of the receiver chain if, for example, the unwanted DC current flows through a switching/mixer stage 210, thereby degrading signal-to-noise ratio performance of the receiver chain.

Therefore, a DC cancellation current generation component 206 is configured to generate a DC cancelation current that cancels the unwanted DC current that is generated due to the differences in supply voltage between the voltage domains 202 and 204. In one embodiment, the DC cancellation current generation component 206 may be configured to generate a DC cancellation current having an amplitude that is substantially equal to that of the unwanted DC current (e.g., that is equal to the voltage potential difference between two domains divided by the resistance of the connection between the two domains), thereby cancelling the unwanted DC current before it reaches the voltage domain biased at a lower supply voltage.

Figure 3:
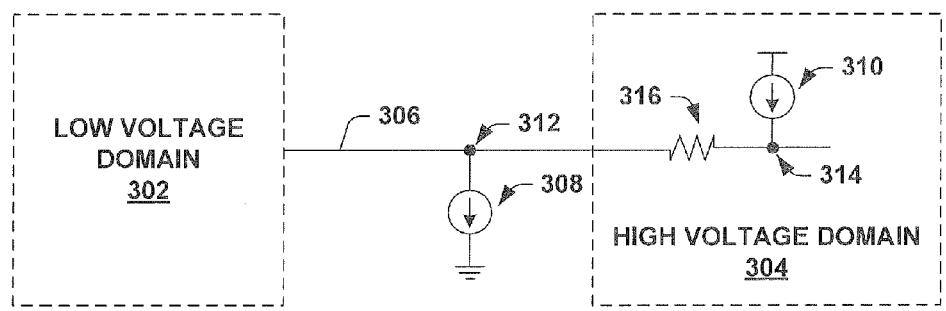
FIG. 3 illustrates a block diagram of a more detailed embodiment of a circuit configured to prevent unwanted DC current from flowing from a region biased at a high supply voltage to a region biased at a low supply voltage.

FIG. 3 illustrates a block diagram of a more detailed embodiment of a circuit 300 configured to prevent unwanted DC bias current from flowing from a region biased at a high supply voltage to a region biased at a low supply voltage. As shown in FIG. 3, the circuit 300 comprises different voltage domains that are biased at different supply voltages: a low voltage domain 302 biased at a low supply voltage and a high voltage domain 304 biased at a high supply voltage. It will be appreciated that as provided herein, the terms low supply voltage and high supply voltage denote a relationship between the different supply voltages and are not intended to limit the value of the supply voltages, but instead denote a potential difference in the supply voltages (e.g., the low supply voltage may comprise any voltage value having a relationship with the high supply voltage such that the low supply voltage is smaller than the high supply voltage).

An electrical connection element 306 having a resistance value 316 is configured to electrically couple the low voltage domain 302 to the high voltage domain 304. Two DC current sources 308 and 310 (e.g., collectively corresponding to the DC cancellation current generator of FIG. 2) are connected to the electrical connection element 306 connecting the low and high voltage domains 302 and 304. The first DC current source 308 is attached to a circuit node 312 having a low DC voltage potential (i.e., biased by a low supply voltage). The second DC current source 310 is attached to a circuit node 314 having a high DC voltage potential.

By biasing the first and second DC current sources 308 and 310 such that the DC current generated by the respective DC current sources is equal to the difference between the high DC voltage potential at circuit node 314 and the low DC voltage potential at circuit node 312 divided by the resistance of the connection element 316, a DC cancellation current having a current value that is equal to the unwanted DC current flow can be generated to flow on the connection element 306 in a manner that cancels the unwanted DC current due to the DC voltage potential difference between the low voltage domain 302 to the high voltage domain 304. In particular, as shown in FIG. 3 the second DC current source 310 injects the DC cancellation current, while the first DC current source 308 removes/absorbs the DC cancellation current, thereby resulting in a substantially zero current that flows to the low voltage domain 302 (i.e., since the DC current sources are located downstream of the low voltage potential domain, the DC cancellation current will cancel the unwanted DC current generated from the potential difference therefore preventing current from flowing to the low voltage circuitry connected directly with the high voltage circuitry).

It will be appreciated that although the use of DC current sources, as provided in relation to FIG. 3, is described below in the context of a differential receiver chain, wherein the low voltage domain comprises a low voltage domain of a receiver chain and the high voltage domain comprises a high voltage domain of the receiver chain, that the use of DC current sources to cancel an unwanted DC current may be applied to any circuit arrangement experiencing unwanted DC currents. For example, DC current sources may be configured in a transmission chain to remove an unwanted DC current caused by a potential difference in the chain. Furthermore, it will be appreciated that although the figures provided herein describe the cancellation of a DC current extending between a circuit having two different voltage potential domains, that it may be applied to a circuit having a plurality of different voltage potential domains (e.g., a first Dc voltage domain having a first potential value, a second DC voltage domain having a second potential value different then the first, a third DC voltage domain having a third potential value different then the first and second, etc.).

Figure 4:
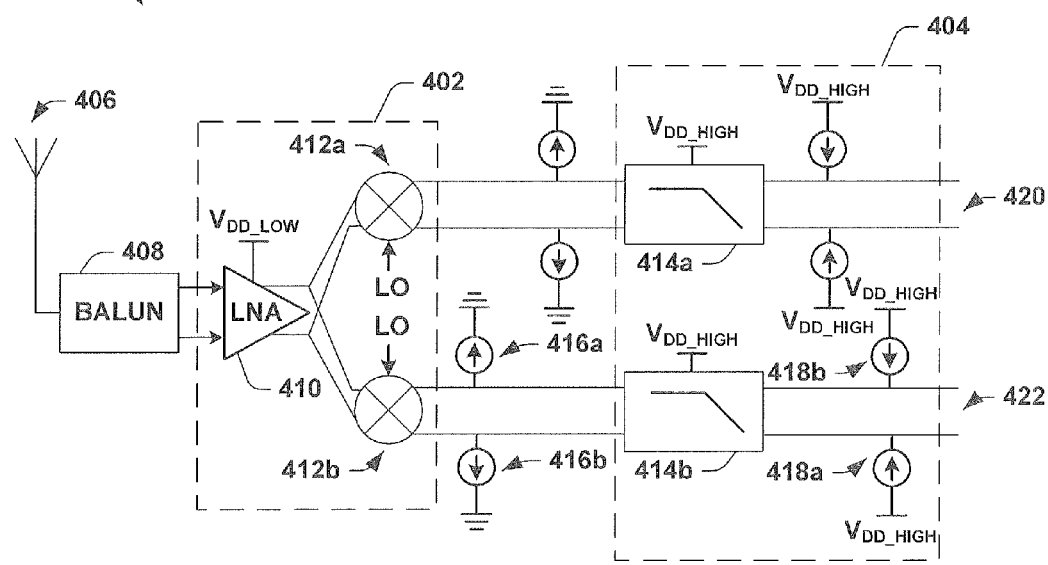
FIG. 4 illustrates a block diagram of a receiver chain comprising a plurality of DC current sources configured to prevent an unwanted DC bias current from flowing through a mixer stage of the receiver chain.

FIG. 4 illustrates a block diagram of a receiver chain 400 comprising a plurality of DC current sources 416 and 418 configured to prevent an unwanted DC bias current from flowing through a mixer stage 412 of the receiver chain. As shown in FIG. 4, a low DC supply voltage $V_{DD\_LOW}$ is applied to the input stage, to reduce power consumption, forming a low DC voltage potential domain 402. A high DC supply voltage $V_{DD\_HIGH}$ is applied to the output stage, to provide for a high dynamic range, forming a high DC voltage potential domain 404.

In particular, an antenna 406 is configured to receive an RF signal that is provided through a balun 408, configured to generate a differential signal from a received single ended signal, to the low DC voltage potential domain 402. The low DC voltage potential domain comprises a differential low noise amplifier (LNA) 410 configured to output an amplified signal to an in-phase path 420 and a quadrature phase path 422. The in-phase and quadrature phase paths respectively comprise a mixer 412a and 412b configured to receive a radio frequency (RF) signal and to downconvert it to an intermediate frequency (IF) signal generated by mixing the received RF signal and a local oscillator (LO) signal. The high DC voltage potential domain comprises a filtering stage 414a and 414b (e.g., low pass filter) configured to receive the output of the respective mixers 412a and 412b and provide filtering of the IF signal.

The difference in supply voltages, between the low voltage domain 402 and the high voltage domain 404 causes an unwanted DC current to flow from the filters 414 to the mixers 412 (e.g., according to Ohm's law, I=V/R), thereby generating unwanted noise in the mixers 412 that degrades system performance. To mitigate (e.g., substantially remove) the unwanted DC current, two DC current sources 416 and 418 are connected to respective wires connecting the low and high voltage domains. The first DC current source 416a or 416b is coupled to a low DC voltage potential node downstream of the mixers 412. The second DC current source 418a or 418b is coupled to a node having a high DC voltage potential. In one embodiment, the second DC current source 418 injects the DC cancellation current, while the first DC current source 416 removes/absorbs the DC cancellation current, thereby resulting in a substantially zero current that flows to the low voltage domain 402.

If the DC current sources 416 and 418 each generate a DC current having a value equal to the difference between the high DC voltage potential and the low DC voltage potential divided by the resistance of the connection, a DC current can be generated on the connection that is equal to the unwanted DC current. Since the DC current sources are located downstream of the mixer stage 412, the DC cancellation current will cancel the unwanted DC current generated from the potential difference prior to it reaching the mixers stage 412, thereby allowing for passive mixer operation (e.g., a low degradation of signal-to-noise ratio in the mixer stages).

Accordingly, selective biasing and the use of additional DC current sources as shown in the receiver chain of FIG. 4 provides for a receiver chain having a low power consumption (due to the low voltage operation in the input stage and high dynamic range, that is enabled by preventing the unwanted DC current from flowing through the mixer/switching stage).

Although the receiver chains shown herein (e.g., in FIG. 4, 5a, 5b, 6, etc.) comprise differential receive chain circuits, it will be appreciated that the apparatus provided herein is not limited to differential circuits. Instead, the method and apparatus provided herein may also be applied to single ended circuits.

Figure 5A:
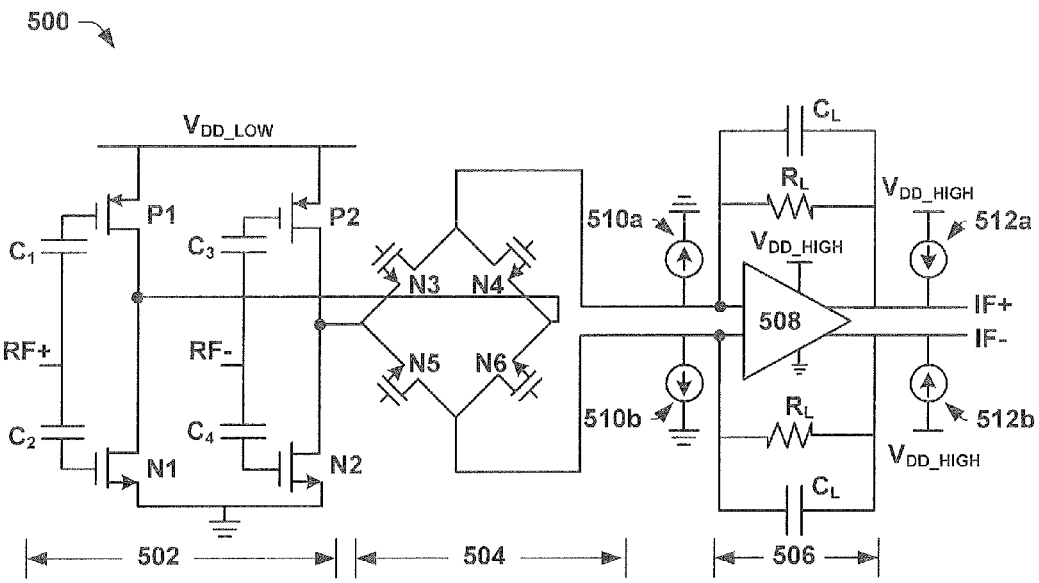
FIG. 5a illustrates a more detailed block diagram of a demodulation circuit, as provided herein.

FIG. 5a illustrates a more detailed block diagram of a receive chain 500, as provided herein. As shown in FIG. 5a, the receiver chain 500 comprises an input/pre-amplifier stage 502, a mixer/switching stage 504, and an output/filtering stage 506. The input stage 502 converts a differential input voltage signal RF+/RF− to a current signal which is then multiplied with a differential local oscillator signal LO+/LO− in the switching stage 504 to generate an IF current signal. The output IF current signal flows from the switching stage 504 to an op-amp based output stage 506 that converts it back to a voltage and provides filtering.

More particularly, the input stage 502 is a transconductor having a broadband low voltage complementary structure configured to convert the received RF voltage signal to an RF current signal. The transconductor consists of differential complementary pairs of transistors. A first transistor pair comprises a first P-type MOSFET transistor P1 having a source coupled to a supply voltage $V_{DD\_LOW}$ and a drain coupled to the drain of a first N-type MOSFET transistor N1. The gates of the first N-type and P-type MOSFET transistors N1 and P1 are configured to receive a first input voltage signal $RF_{IN}+$. A second transistor pair comprises a second P-type MOSFET transistor P2 having a drain coupled to the drain of a second N-type MOSFET transistor N2 having a source coupled to ground together with the source of N1. The gates of the second N-type and P-type MOSFET transistors N2 and P2 are configured to receive a second input voltage signal $RF_{IN}-$. In one embodiment, the differential input voltage signals RF+/RF− may be AC coupled into the pre-amplifier stage through several capacitors C1-C4. During operation, the transconductor generates a differential RF current that is provided to the switching stage 504.

The switching stage 504 comprises four switching transistors N3-N6 configured to form a double balanced structure having differential pairs of transistors. The sources of the respective pairs of switching transistors are connected to the output of the transconductor to receive the differential output signal. The gates of the differential MOSFET pairs are configured to respectively receive a differential input signal LO+/LO−. The mixer demodulates the incoming RF current signal to an IF current signal by generating a differential IF output current signal comprising the product of LO and RF signals, which is fed to output/filtering stage 506 for conversion back to a voltage signal.

The output/filtering stage 506 comprises a high-voltage active RC filter having an amplifying element 508 comprising a differential operational amplifier having two feedback loops. Respective feedback loops comprise a capacitor $C_F$ and resistor $R_F$ configured in parallel to behave like an active low pass filter configured to pass low frequency signals while attenuating high frequency signals. For example, at low frequencies the feedback capacitor $C_F$ acts like an open circuit blocking feedback signals while the feedback resistor $R_F$ gives the circuit the characteristics of an inverting amplifier. At high frequencies the capacitor $C_F$ shorts out the feedback resistor $R_F$ and acts as an integrator.

The first pair of DC current sources 510a and 510b are placed in each branch of the differential current output from the low voltage switching stage 504. The second pair of DC current sources 512a and 512b are placed in each branch of the differential voltage output from the output stage 506. As explained above, by operating the first and second pair of DC current sources to selectively generate a DC cancellation current between the output stage 506 and the switching stage 504, an unwanted DC current due to potential voltage differences between circuit stages can be prevented from flowing into the switching stage 504. In particular, by biasing the DC current sources such that the DC current generated by each of the DC current sources is equal to the difference between the high DC potential and the low DC potential divided by the resistance of the connection (i.e., $I_{DC}$ ($V_{DC,HV}$–$V_{DC,LV}$)/$R_F$, wherein $R_F$ is the feedback resistor of the output stage), a DC cancellation current can be generated that is equal to the unwanted DC current caused by the differences in the supply voltages of the input stage and the output stage thereby allowing passive operation of the switching stage and preventing degradation of SNR.

It will be appreciated that for proper circuit operation, the common mode voltage at the input of the filter may be set equal to half the low supply voltage $V_{DD\_LOW}$, whereas the common mode voltage at the output of the filter equals to half the high supply voltage $V_{DD\_HIGH}$. Two pairs of current sources, a first pair of DC current sources 510 and a second pair of DC current sources 512, are added to each of two differential branches so as to cancel unwanted DC current flow from the high voltage output stage 506 into the low voltage switching stage 504.

It will also be appreciated that the additional DC current sources may inject noise into the receiver chain. However, the noise generated by the additional DC current sources may be minimized to make its impact negligible on the circuit operation. For example, in one embodiment, the dimension of the DC current sources can be scaled in such a way as to minimize their noise contribution.

Figure 5B:
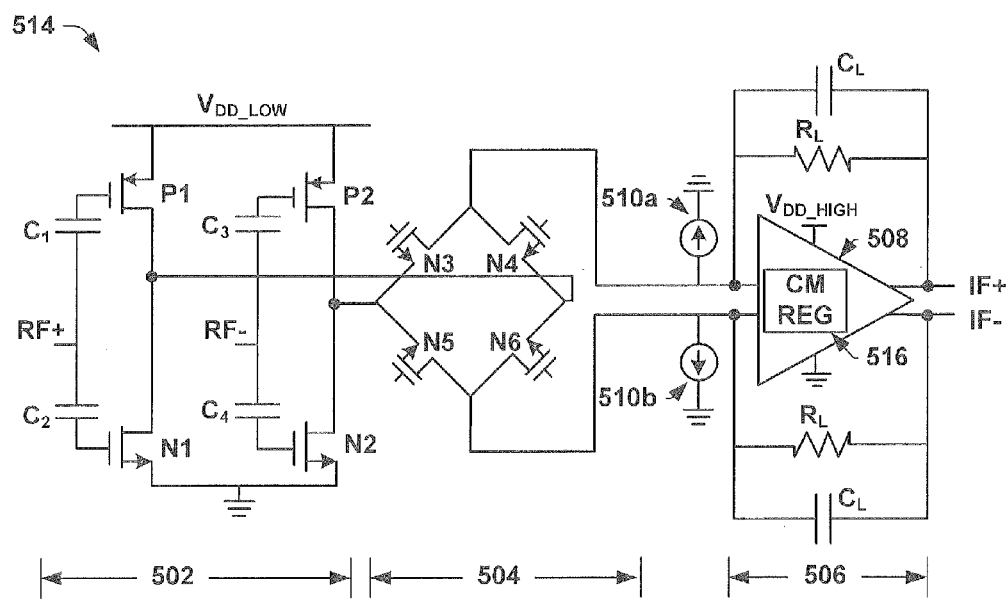
FIG. 5b illustrates a more detailed block diagram of an alternative embodiment of a demodulation circuit, as provided herein.

FIG. 5b illustrates a more detailed block diagram of an alternative receive chain 500, as provided herein. As described above, the receiver chain 514 comprises an input/pre-amplifier stage 502, a mixer/switching stage 504, and an output/filtering stage 506. The output/filtering stage comprises an amplifier having a common mode regulation circuit 516. The common mode regulation circuit 516 is configured to sense a common mode output voltage to vary operation of the amplifier to compensate for displacement of the common mode output voltage from a desired value (i.e., to inject a common mode current to the amplifier 508 based upon a comparison of an output common mode voltage with a reference voltage).

The common mode current generated by the output stage's common mode regulation circuit 516 may be configured to generate the DC cancellation current, thereby allowing for the second pair of DC current sources 512a and 512b to be omitted. Accordingly, as shown in FIG. 5b, the receiver chain 514 comprises a first pair of DC current sources 510a and 510b that are placed in each branch of the differential current output from the low voltage switching stage 504, and which in conjunction with the common mode regulation circuit 516 cancel an unwanted DC current flow from the high voltage output stage 506 into the low voltage switching stage 504.

Figure 6:
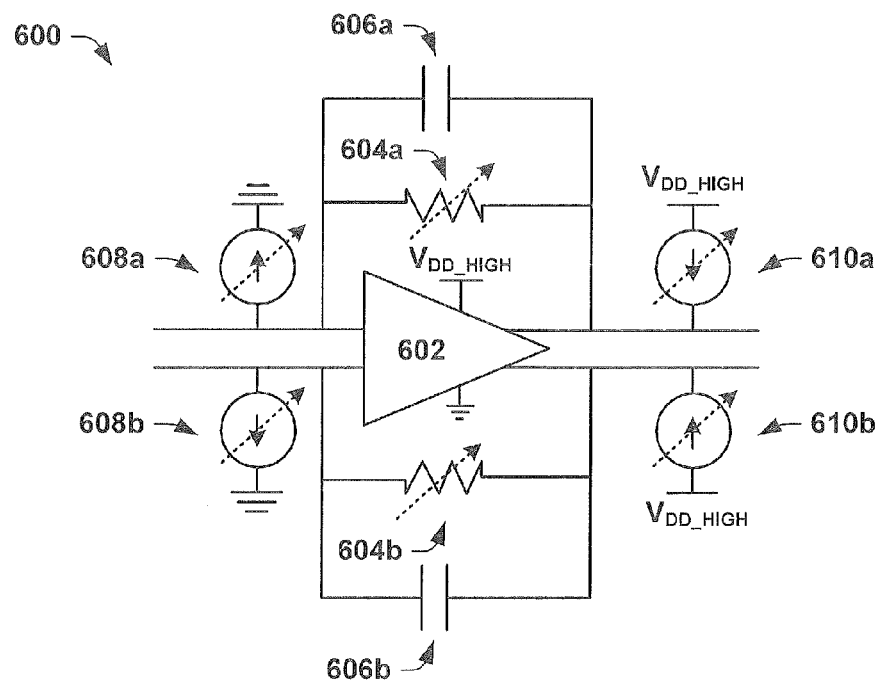
FIG. 6 illustrates a circuit diagram of a high-voltage active RC filter output stage comprising a differential operational amplifier configured to implement a gain switching functionality.

In one embodiment a receiver output stage comprising the DC current sources provided herein may be configured to implement gain steps as part of an automatic gain control mechanism. FIG. 6 illustrates a circuit diagram of a high-voltage active RC filter output stage 600 comprising a differential operational amplifier 602 configured to implement a gain switching functionality (e.g., configured to implement gain steps in the filter stage). The operational amplifier 602 has two feedback loops, respectively comprising a capacitor $C_F$ and a variable feedback resistor $R_F$, configured in parallel as described above. Since the gain of the whole demodulator is proportional to the value of the variable feedback resistor $R_F$ (e.g., the gain is equal to the current gain of the receiver circuit multiplied by the value of the feedback resistor), a gain switching functionality may be enabled by selectively chaining the resistance of the variable feedback resistors $R_F$. For example, if the resistance of a variable feedback resistor $R_F$ is increased, then the gain of the output stage is increased. Alternatively, if the resistance of the variable feedback resistor $R_F$ is decreased, then the gain of the output stage is decreased.

Since the unwanted DC current is inversely proportional to the value of the variable feedback resistors $R_F$ (i.e., is equal to the voltage potential difference between two domains divided by the resistance of the connection between the two domains), the DC current sources 608 and 610 coupled to the low and high voltage potential nodes comprise variable current sources. The variable DC current sources 608 and 610 are configured to output an adjustable current value, configured to adjust the value of the DC cancellation current (i.e., $I_{DC}$= ($V_{DC,HV}$–$V_{DC,LV}$)/$R_F$) based upon the value of the variable feedback resistors and thereby accounting for the change in the variable feedback resistor. For example, if the resistance of the variable feedback resistor is increased (e.g., from R1 to R2) to increase the gain of the output stage, the DC current generated by the DC current sources is reduced (e.g., from I=ΔV/R1 to ΔV/R2) to maintain a DC cancellation current that is equal to the unwanted DC current generated by the difference in voltage potentials between the high and low voltage domains.

Figure 7:
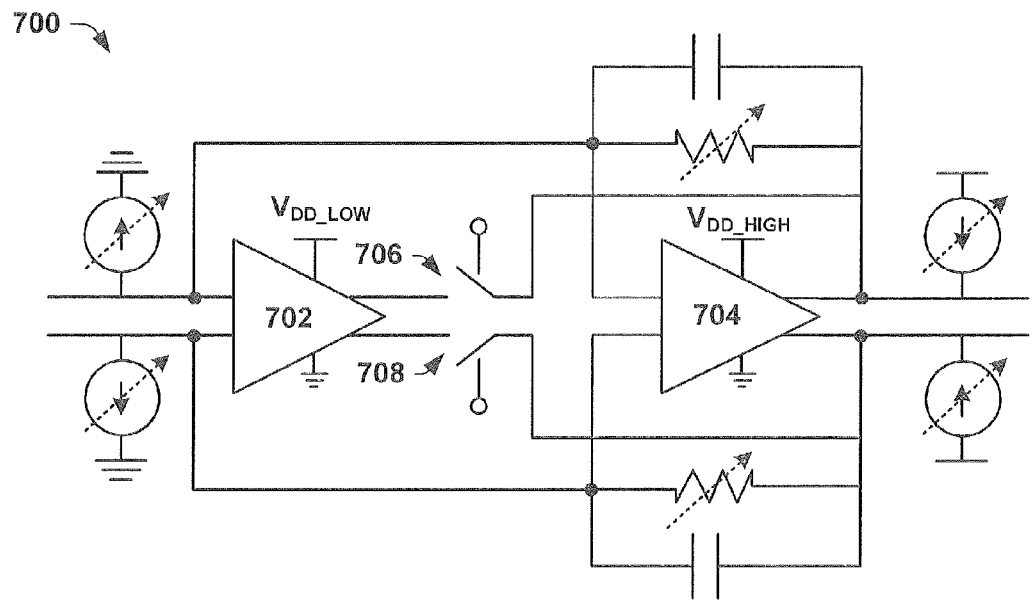
FIG. 7 is a circuit diagram of a reconfigurable output stage coupled to DC current sources configured to cancel unwanted current, as provided herein.

In another embodiment a receiver output stage comprising the DC current sources provided herein may comprise a reconfigurable output stage. FIG. 7 illustrates a circuit diagram of an output stage 700 comprising a reconfigurable output stage. The reconfigurable output stage 700 may be configured to operate in multiple modes of operation. For example, in one embodiment, the reconfigurable output stage 700 may be comprised within a receiver chain configured to operate in multimode applications, wherein certain modes of operation require large voltage headroom at the output of the downconverter while for other modes, a low supply voltage for biasing the entire receiver chain is sufficient.

The reconfigurable output stage 700 comprises a first operational amplifier 702 biased according to a first (e.g., low) supply voltage coupled in parallel with a second operational amplifier 704 biased according to a second (e.g., high) supply voltage. During operation, the circuit is configured to operate such that one of the operational amplifiers is activated while the other operational amplifier is deactivated. For example, for an application that utilizes a large supply voltage, the first operational amplifier 702 biased with a low supply voltage may be deactivated, while the second operational amplifier 704 biased with a high supply voltage may be activated. Alternatively, for an application that utilizes a low operating power, the first operational amplifier 702 biased with a low supply voltage may be activated, while the second operational amplifier 704 biased with a high supply voltage may be deactivated.

In one embodiment, in order not to degrade large signal linearity performance of the second (e.g., high voltage) operational amplifier 704, the outputs of the first (e.g., low voltage) operational amplifier 702 may be isolated using transmission gates 706 and 708. In one embodiment, the transmission gates 706 and 708 are configured to be turned off when the first (e.g., low voltage) operational amplifier 702 is turned off to prevent large voltage swings at the output the active second (e.g., high voltage) operational amplifier 704, which could bias the output devices of the low voltage op-amp in the reverse region, introducing an undesired distortion.

It will be appreciated that in various embodiments the transmission gates 706 and 708 may comprise various circuit components configured to generate a short circuit when on an open when off. For example, the transmission gates may comprise analog switches, transistors, etc. or a digital equivalent thereof, which may be controlled by a control signal generated by a control circuit based upon the mode of operation of the output stage.

Figure 8:
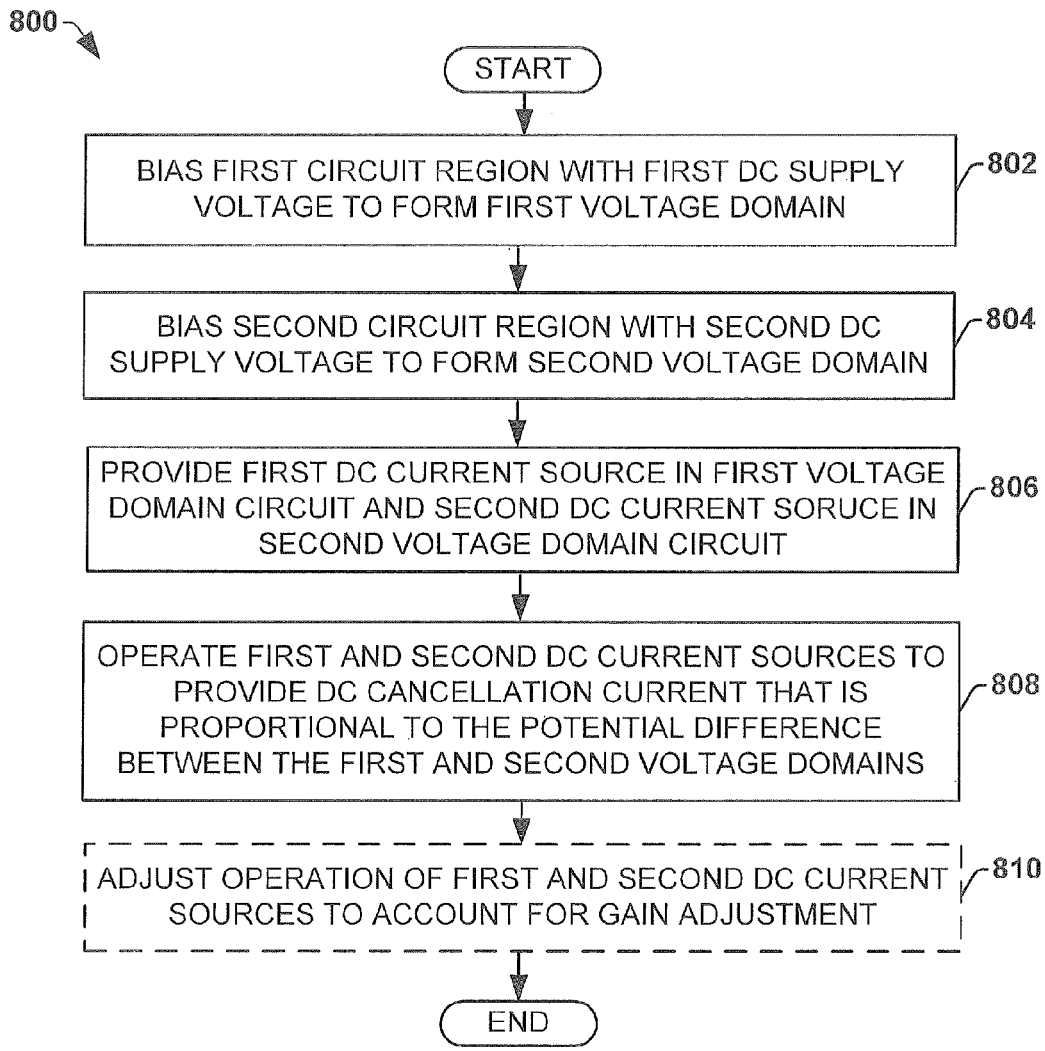
FIG. 8 is a flow diagram of an exemplary method for preventing an unwanted DC current from flowing from a high DC voltage potential domain of a circuit to a low DC voltage potential domain.

FIG. 8 is a flow diagram of an exemplary method 800 for preventing an unwanted DC current from flowing from a high DC voltage potential domain of a circuit to a low DC voltage potential domain.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 2, 3, 4, etc., are non-limiting examples of circuits that may be used to implement method 800). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 802 a first circuit region is biased with a first DC supply voltage to form a first voltage domain. The first DC supply voltage may comprise a low or high DC supply voltage. In one embodiment, the first supply voltage comprises a low DC supply voltage configured to bias an input stage of a receiver chain.

A second circuit region is biased with a second DC supply voltage to form a second voltage domain at 804. The second DC supply voltage may comprise a low or high DC supply voltage that is different then the first DC supply voltage. For example, if the first DC supply voltage is a low DC supply voltage then the second DC supply voltage may be a high DC supply voltage. In one embodiment, the second supply voltage comprises a high DC supply voltage configured to bias an output stage of a receiver chain.

At 806 a first DC current source is provided in the first voltage domain and a second DC current source is provided in the second voltage domain. In one embodiment, the first DC current source may be coupled to a circuit node having a low DC voltage potential (e.g., downstream of a demodulation circuit), while the second DC current source may be coupled to a circuit node having a high DC voltage potential. It will be appreciated that the terms first and second DC current sources are not limiting but instead may comprise multiple current sources, for example in a differential circuit comprising two DC current sources connected to each wire connecting the low and high voltage domains.

At 808 the first and second DC current sources are operated to provide a DC cancellation current that is proportional to the difference between the first and second DC voltage potential. In one embodiment, the first and second DC current sources are configured to generate a DC cancellation current that is equal to the difference between the first supply voltage and the second DC supply voltage divided by a resistance therebetween. In one embodiment, the second DC current source may inject the DC cancellation current into a circuit while the first DC current source removes/absorbs the DC cancellation current from the circuit.

At 810 the operating point of the first and second DC current sources may be adjusted to account for adjustments in the gain of the circuit. For example, if the value of a variable feedback resistor in the output stage is increased to increase the gain of the output stage, the DC current generated by the DC current sources is reduced to maintain a DC cancellation current that is equal to the unwanted DC current generated by the difference in voltage potentials between the high and low voltage domains.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A circuit, comprising:
   a transceiver chain having an antenna port configured to couple to an antenna for transmission or reception of a radio frequency (RF) signal;
   a first DC current source coupled to a first circuit node located within a first voltage domain of the transceiver chain, wherein the first voltage domain is defined as a difference between a first high DC supply voltage and a first low DC supply voltage employed for one or more circuits within the first voltage domain; and
   a second DC current source coupled to a second circuit node located within a second voltage domain of the transceiver chain at a position downstream of the first circuit node, wherein the second voltage domain is defined as a difference between a second high DC supply voltage and a second low DC supply voltage employed for one or more circuits within the second voltage domain, and wherein the first voltage domain and the second voltage domain are different;

wherein the first and second DC current sources are configured to generate a DC cancellation current configured to cancel an unwanted DC current between the first circuit node and the second circuit node that is due to a potential difference between the first voltage domain and the second voltage domain.

2. The circuit of claim 1, wherein the first circuit node and the second circuit node are disposed downstream of a mixer located within the transceiver chain.

3. The circuit of claim 1, further comprising:
an input stage biased at the first DC supply voltage that generates the first voltage potential and configured to convert a received radio frequency (RF) voltage signal to an RF current signal;
a switching stage coupled to the output of the input stage and configured to downconvert the RF current signal to an intermediate (IF) current signal; and
an output stage biased at the second DC supply voltage that generates the second voltage potential, wherein the output stage is coupled to the output of the switching stage and configured to convert the IF current signal to a IF voltage signal,
wherein the first DC current source is coupled to the input of the output stage and the second DC current source is coupled to the output of the output stage, and
wherein the second DC supply voltage is greater than the first DC supply voltage.

4. The circuit of claim 1,
wherein the DC cancellation current is equal to the voltage potential difference between the first circuit node and the second circuit node divided by a resistance of a path connecting the first and second circuit nodes.

5. The circuit of claim 1, further comprising:
a differential path, having a first branch and a second branch, configured to connect the first circuit node to the second circuit node,
wherein the first DC current source is configured to provide a first DC cancellation current into the first branch and the second branch of the differential path; and
wherein the second DC current source is configured to provide a second DC cancellation current into the first branch and the second branch of the differential path.

6. The circuit of claim 3, wherein the output stage comprises an operational amplifier having one or more feedback loops comprising a variable feedback resistor configured to implement a gain switching functionality, and wherein the first and second DC current sources comprise variable current sources configured to modify the DC cancellation current based upon changes in the variable feedback resistor.

7. The circuit of claim 3, wherein the second DC current source comprises a common-mode regulation circuit comprised within the output stage and configured to inject the DC cancellation current, and wherein the first DC current source comprises a variable current source configured to remove the DC cancellation current.

8. The circuit of claim 3, wherein the output stage comprises a reconfigurable output stage, comprising a first operational amplifier biased according to the high supply voltage.

9. The circuit of claim 8, wherein the output stage further comprises a second operational amplifier connected in parallel with the first operational amplifier and biased according to the first high DC supply voltage and the first low DC supply voltage.

10. The circuit of claim 9, wherein the output of the first operational amplifier is selectively isolated from the second operational amplifier when the first operational amplifier is enabled.

11. A receiver chain circuit, comprising:
an antenna port configured to couple to an antenna for transmission or reception of a radio frequency (RF) signal;
a first voltage domain located downstream of the antenna port, wherein the first voltage domain is defined as a difference between a first high DC supply voltage and a first low DC supply voltage employed for one or more circuits within the first voltage domain;
a second voltage domain connected to the first voltage domain by a differential path having a first branch and a second branch, wherein the second voltage domain is located downstream of the first voltage domain, wherein the second voltage domain is defined as a difference between a second high DC supply voltage and a second low DC supply voltage employed for one or more circuits within the second voltage domain, wherein the first voltage domain and the second voltage domain are different; and
a DC cancellation current generation component configured to generate a DC cancellation current that cancels an unwanted DC current generated by the potential difference between the first voltage domain and the second voltage domain.

12. The circuit of claim 11, wherein the DC cancellation current generation component comprises:
one or more first DC current sources configured upstream of the second voltage domain at a first node having the first voltage domain; and
one or more second DC current sources configured at a second node within the second voltage domain having the second voltage domain;
wherein the second voltage domain is greater than the first voltage domain;
wherein the second DC current sources are configured to generate the DC cancellation current having a value that cancels the unwanted DC current, and wherein the first DC current sources are configured to remove the DC cancellation current.

13. The circuit of claim 11,
wherein the first voltage domain comprises:
an input stage biased at the first high DC supply voltage and the first low DC supply voltage, and configured to convert a received radio frequency (RF) voltage signal to an RF current signal;
a switching stage coupled to the input stage and configured to downconvert the RF current signal to an intermediate frequency (IF) current signal;
and wherein the second voltage domain comprises an output stage biased at the second high DC supply voltage and the second low DC supply voltage, the output stage coupled to the output of the switching stage and configured to convert the IF current signal to an IF voltage signal,
wherein the second voltage domain is greater than the first voltage domain.

14. The circuit of claim 12,
wherein the one or more first DC current sources are configured to provide a first DC cancellation current into the first branch and the second branch of the differential path; and wherein the one or more second DC current sources are configured to provide a second DC cancellation current into the first branch and the second branch of the differential path.

15. The circuit of claim 12, wherein the first circuit node and the second circuit node are located downstream of a mixer located within the receiver chain.

16. The circuit of claim 13, wherein the output stage comprises an operational amplifier having one or more feedback loops comprising a variable feedback resistor configured to implement a gain switching functionality, and wherein the first and second DC current sources comprise variable current sources configured to modify the cancellation current based upon changes in the variable feedback resistor.

17. The circuit of claim 13, wherein the output stage comprises a reconfigurable output stage, comprising a first operational amplifier biased according to a high DC supply voltage and a second operational amplifier connected in parallel with the first operational amplifier and biased according to a low DC supply voltage.

18. The circuit of claim 17, wherein the output of the first operational amplifier is selectively isolated from the second operational amplifier when the first operational amplifier is enabled.

19. A method for removing an unwanted DC current from a circuit having different voltage potentials, comprising:
    biasing a first circuit region with a first high DC supply voltage and a first low DC supply voltage to generate a first voltage domain defined as a difference therebetween and biasing a second circuit region with a second high DC supply voltage and a second low DC supply voltage to generate a second voltage domain, defined as a difference therebetween, wherein the first voltage domain and the second voltage domain are different;
    providing a first DC current source in the first voltage domain and a second DC current source in a second voltage domain; and
    operating the first and second DC current sources to provide a DC cancellation current that cancels an unwanted DC current generated by a potential difference between the first voltage domain and the second voltage domain.

20. The method of claim 19, wherein:
the first voltage domain comprises an input stage biased at the first DC supply voltage and the first low DC supply voltage and configured to convert a received radio frequency (RF) voltage signal to an RF current signal and a switching stage coupled to the output of the input stage and configured to downconvert the RF current signal to an IF current signal,
the second voltage domain comprises an output stage biased at the second DC supply voltage and the second low DC supply voltage, the output stage coupled to the output of the switching stage and configured to convert the IF current signal to an IF voltage signal,
wherein the second voltage domain is greater than the first voltage domain; and
the first DC current source is coupled between the input of the output stage and the switching stage and the second DC current source is coupled to the output of the output stage.

* * * * *